(12) United States Patent
Chang et al.

(10) Patent No.: US 7,371,671 B2
(45) Date of Patent: May 13, 2008

(54) SYSTEM AND METHOD FOR PHOTOLITHOGRAPHY IN SEMICONDUCTOR MANUFACTURING

(75) Inventors: Ching-Yu Chang, Yilang County (TW); Chin-Hsiang Lin, Hsin-Chu (TW); Burn Jeng Lin, Hsin-Chu (TW)

(73) Assignee: Taiwan Semiconductor Manufacturing Company, Ltd., Hsin-Shu (TW)

( * ) Notice: Subject to any disclaimer, the term of this patent is extended or adjusted under 35 U.S.C. 154(b) by 443 days.

(21) Appl. No.: 11/050,312

(22) Filed: Feb. 3, 2005

(65) Prior Publication Data

US 2006/0172520 A1 Aug. 3, 2006

(51) Int. Cl.
*H01L 21/3205* (2006.01)
*H01L 21/4763* (2006.01)

(52) U.S. Cl. .................. 438/592; 438/604; 438/695; 438/312

(58) Field of Classification Search .............. 438/592, 438/42, 691, 692, 720, 695; 257/751, 712, 257/762; 204/15
See application file for complete search history.

(56) References Cited

U.S. PATENT DOCUMENTS

| 4,227,975 A | * | 10/1980 | Hartman et al. ............ 438/604 |
| 5,858,620 A | | 1/1999 | Ishibashi et al. |
| 6,492,075 B1 | | 12/2002 | Templeton et al. |
| 6,680,252 B2 | * | 1/2004 | Chen et al. ................. 438/691 |
| 6,756,673 B2 | * | 6/2004 | Ahn et al. ................... 257/751 |

OTHER PUBLICATIONS

Brakensiek, N. et al., Wet-recess Process Optimization of a Bottom Antireflective Coating for the Via First Dual Damascene Scheme, 2004, Proceedings of SPIE: Advances in Resist Technology and Processing XXI, vol. 5376, pp. 1-7.*

* cited by examiner

*Primary Examiner*—Michael Lebentritt
*Assistant Examiner*—Kenisha V Ford
(74) *Attorney, Agent, or Firm*—Haynes Boone, LLP

(57) ABSTRACT

A method for forming a semiconductor device includes forming a photoresist layer over a substrate and patterning the photoresist layer to form photoresist portions. A second layer is formed over the substrate in areas not covered by the photoresist portions and the photoresist portions are removed. After removing the photoresist portions, the second layer is used to modify the substrate to create at least a portion of the semiconductor device.

23 Claims, 2 Drawing Sheets

SYSTEM AND METHOD FOR PHOTOLITHOGRAPHY IN SEMICONDUCTOR MANUFACTURING

BACKGROUND

The present disclosure relates generally to the manufacturing of semiconductor devices, and more particularly to a photolithography process in semiconductor manufacturing.

During the manufacturing of semiconductor devices, one of the requirements is a suitable depth of focus (DOF) window. Generally, an effective DOF covers all the variations of the photoresist thickness, local substrate topology step height, and wafer center and edge step height differences. It is desired that a semiconductor device be manufactured within the desired critical dimension (CD) specification without scum or top loss defects.

As the sizes of semiconductor devices continue to decrease, semiconductor manufacturers strive to devise photolithography processes that accommodate the needs of customers.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
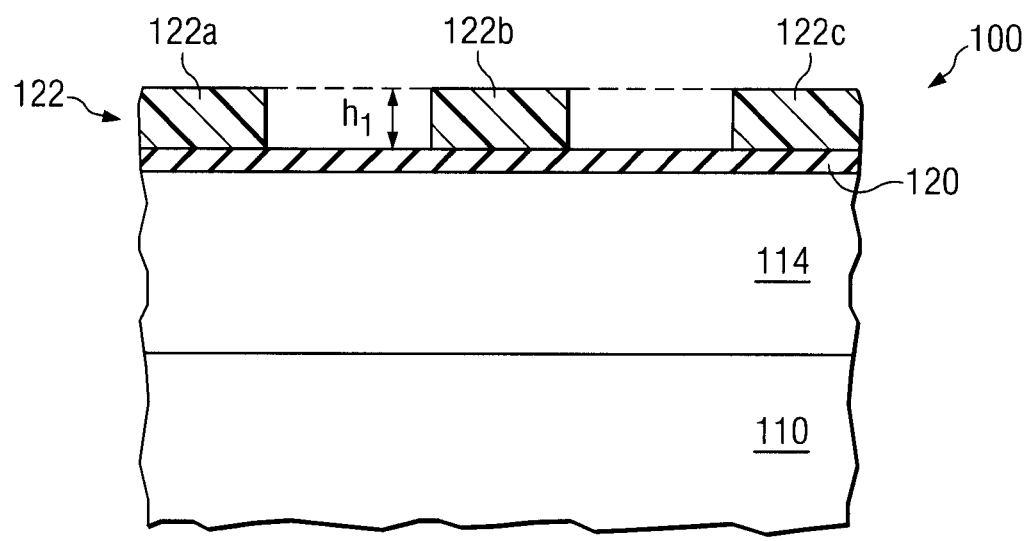
FIGS. 1-5 illustrate different stages of a partial semiconductor device for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Traditionally, the thickness of a photoresist layer is about 3000 angstroms. However, such a thickness may be too great for the DOF requirement. For example, if the DOF is less than the thickness of the photoresist layer plus step high variation, scum or CD errors may become present in some of the patterns formed on the semiconductor devices.

Thin photoresist layers are also desirable for low dosage exposure tools, such as an e-beam or extreme ultraviolet (EUV) tool, as they improve resist contrast, resolution and dissolution. Moreover, for mass production purposes, the combination of thin photoresist layers and low dosage exposure tools will increase the throughput of semiconductor devices.

On the other hand, a thin photoresist layer may adversely affect etching performance, causing etch pattern transfer errors.

Therefore, what is desired is a new and improved photolithography process.

The improved photolithography process may include an exemplary bi-layer photoresist described in connections with FIGS. 1-5. First, a relatively thin photoresist layer, the thickness of which may be approximately between about 200 angstroms and about 2,000 angstroms, may be developed to form photoresist portions. Then, a second layer may be formed adjacent to the photoresist portions for etching and/or implanting purposes.

Referring now to FIG. 1, shown therein is an exemplary partial semiconductor device 100 for implementing one or more embodiments of the present invention. In one embodiment, the partial semiconductor device 100 includes a substrate 110, a dielectric layer 114, a bottom anti-reflective coating (BARC) layer 120, and photoresist portions 122*a*, 122*b* and 122*c*.

The substrate 110 may include one or more insulator, conductor, and/or semiconductor layers. For example, the substrate 110 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 110 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 110 may also or alternatively include a multiple silicon structure or a multilayer compound semiconductor structure.

The dielectric layer 114 may be deposited over the surface of the substrate 110. The dielectric layer 114 may be formed by chemical vapor deposition (CVD), plasma-enhanced CVD (PECVD), atomic layer deposition (ALD), physical vapor deposition (PVD), spin-on coating and/or other processes. The dielectric layer 114 may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

The BARC layer 120 may be deposited over the dielectric layer 114 by a variety of techniques, including but not limited to spin-on coating, PVD, CVD, and/or other processes.

In one example, the BARC layer 120 may absorb the light that inadvertently penetrates the bottom of a photoresist layer (not shown). To perform the light absorption, the BARC layer 120 may include a material with a high extinction coefficient, and/or considerable thickness. On the other hand, a high coefficient of the BARC layer 120 may lead to the high reflectivity of the BARC layer, which counters the effectiveness of the BARC layer 120. Accordingly, it is contemplated that the BARC layer 120 may possess an absorption index value at approximately between about 0.2 to about 0.6, and may possess a thickness of about 80 nm. However, it is noted that other ranges of coefficient values and thickness are also contemplated by the present disclosure.

Additionally or alternatively, an index matching approach may be adopted for the BARC layer 120. In that case, the BARC layer 120 may include a material with a refraction index and thickness that match those of the light used in a subsequent process. In operation, once the light strikes the BARC layer 120, a portion of the light is reflected therefrom. Meanwhile, another portion of the light enters the BARC layer 120 and is transformed into a light with a shifted phase, which interferes with the first portion of the light that is reflected from the BARC layer 120, resulting in the reduction of the light reflectivity.

It is contemplated that the BARC layer 120 may employ both the light absorption and index matching approaches to achieve the desired results. In some instances, the inorganic BARC layer 120 may simply remain over the dielectric layer 114 and serve as a diffusion barrier for the partial semiconductor device 100, as the removal of the BARC layer 120 may be difficult to accomplish.

In furtherance of the example, a photoresist layer 122 may be deposited over the BARC layer 120. The photoresist layer 122 may be formed by spin-on coating and/or other processes. In operation, a photoresist solution is dispensed onto the surface of the BARC layer 120, and the partial semiconductor device 100 is spun rapidly until the photoresist solution is almost dry. In one example, the photoresist layer may be a chemically amplified resist that employs acid catalysis. In that case, the photoresist layer may be formulated by dissolving an acid sensitive polymer in a casting solution. In one embodiment, the height h1 of the photoresist layer 122 may be approximately between about 200 angstroms and 500 angstroms. It is contemplated that the height h1 may also be less than 200 angstroms or greater than 500 angstroms.

Following the deposition of the photoresist layer 122, the partial semiconductor device 100 may undergo soft bake, exposure, post-exposure bake, and development processes by methods known in the art to form the photoresist portions 122a, 122b and 122c. In one embodiment, the tools utilized for the exposure process may include a dry system, an immersion system, an e-beam system, an EUV system, and/or other suitable systems. In another embodiment, the exposure wavelength is between about 10 nanometers and about 450 nanometers.

Figure 2:
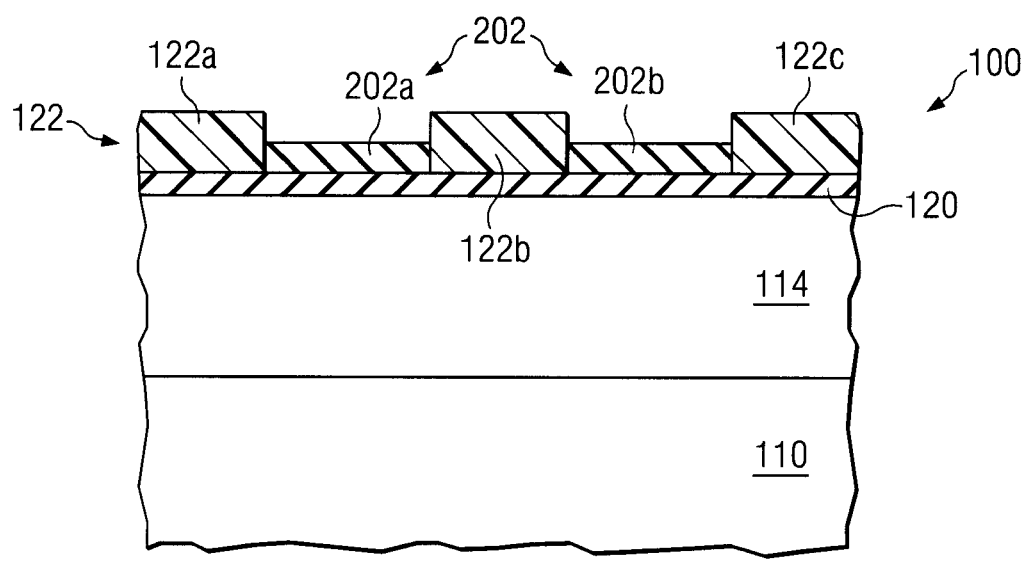

Referring now to FIG. 2, shown therein is a further developed view of semiconductor device 100. In one embodiment, a second layer portion 202a may be formed over the BARC layer 120 and between the photoresist portions 122a and 122b. Similarly, a second layer portion 202b may be formed between the photoresist portions 122b and 122c. In one example, at least one of the second layer portions 202a and 202b may be in contact with the BARC layer 120. In another example, at least one of the second layer portions 202a and 202b may be in contact with at least one of the respective sidewalls of the corresponding photoresist portions.

For the purposes of this disclosure, the second layer portions 202a and 202b are collectively referred to herein as the second layer 202. The second layer 202 may be formed by coating, deposition, and/or any other suitable methods. The second layer 202 may be bonded with the BARC layer 120 by a variety means, such as chemical bonding, ionic bonding, van der waal bonding, and/or other bonding methods. In one example, following the coating of the second layer 202 over the BARC layer 120, the partial semiconductor device 200 may be heated to induce chemical bonding between the second layer 202 and the BARC layer 120. The chemical bonding may include a dehydration process, an ester reaction, and/or other suitable processes. In one example, the chemical bonding may result from reactions between a first group, which may include carboxylic, hydroxyl, and/or other materials; and a second group, which may include hydroxyl, alkyl, halogen, and/or other materials. Following the chemical bonding process, the remaining un-reacted portion of the second layer 202 may be removed by de-ionized water, a developer, a solvent, or any other suitable material.

Alternatively or additionally, the second layer 202 may be formed laterally over the applicable sidewalls of the photoresist portions. In that case, acid(s) from the photoresist layer 122 may be transferred to the second layer 202, causing cross linkage. Again, Following the cross linkage process, the remaining un-reacted portion of the second layer 202 may be removed by de-ionized water, a developer, a solvent, or any other suitable material.

The second layer 202 may include a variety of materials. In one embodiment, the second layer 202 may include an organic material, such as a polymer and/or other suitable materials. In a second embodiment, the second layer 202 may include an inorganic material, such as oxide, nitride, silicon, a low-k material, and/or other materials. Alternatively or additionally, the second layer 202 may include Si, Ti, Ta, TiN, W, Fe, Cu, C, H, N, O, double bond, benzyl, phenyl, triple bond atom and molecular, and/or other components. The second layer 202 may be a liquid, a solid substance, and/or a combination thereof.

Figure 3:
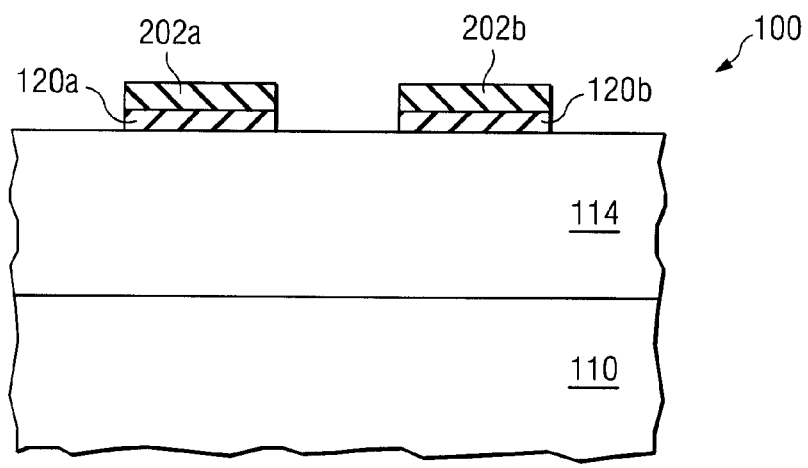

Referring now to FIG. 3, shown therein is a further developed partial view of semiconductor device 100. In one embodiment, the photoresist portions 122a, 122b, 122c and their corresponding portions of the BARC layer 120 of FIG. 2 have been removed, forming remaining portions 120a and 120b of the BARC layer 120. The removal may be accomplished by a variety of methods, such as exposure, dry etching, wet etching, plasma etch treatment, solvent etch treatment, and/or other methods.

Figure 4:
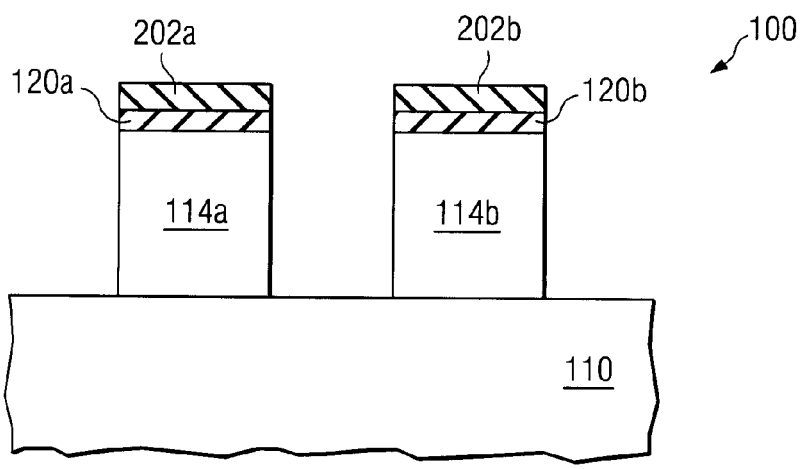

Referring now to FIG. 4, in one embodiment, the exposed portions of the dielectric layer 114 of FIG. 3 have been removed by a variety of methods, such as etching (drying etching or wet etching), and/or other processes, forming remaining portions 114a and 114b of the dielectric layer 114, as they were protected by the second layers 202a and 202b.

Figure 5:
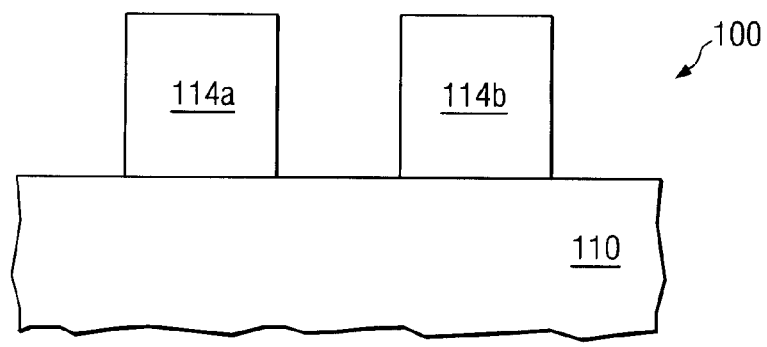

Referring now to FIG. 5, in one embodiment, the second layer portions 202a, 202b and the remaining BARC layer portions 120a and 120b have been removed from the partial semiconductor device 100 by methods known in the art.

Thereafter, additional steps are adopted for forming a complete semiconductor device. Since those additional steps are known in the art, they will not be further described herein.

It is noted that many variations of the above example are contemplated herein. In one example, instead of utilizing the second layer 202 for etching purposes, it may be used for implanting purposes. In a second example, the second layer portions 202a and 202b (and an additional second layer portion) may be formed over the photoresist portions 122a, 122b, and 122c, respectively. In that case, the photoresist portions 122a, 122b and 122c will remain on the partial semiconductor device during the etching of the BARC layer 120 and the dielectric layer 114. Therefore, a variety of modifications are contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for forming a semiconductor device, comprising:
   forming a first layer over a substrate, wherein the first layer includes a photoresist layer;
   patterning the photoresist layer to form photoresist portions;
   forming a second layer over the substrate in areas not covered by the photoresist portions;
   removing the photoresist portions;
   after removing the photoresist portions, using the second layer to protect a portion of the substrate, thereby providing an unprotected portion of the substrate; and
   modifying the unprotected portion of the substrate to create at least a portion of the semiconductor device.

2. The method of claim 1 wherein modifying the unprotected portion of the substrate includes an etching process for patterning the substrate.

3. The method of claim 1 further comprising etching portions of a bottom anti-reflective coating (BARC) layer that are not protected by the second layer.

4. The method of claim 1 further comprising etching portions of a dielectric layer that are not protected by the second layer.

5. The method of claim 1 wherein modifying the unprotected portion of the substrate includes an implantation process.

6. The method of claim 1 wherein the thickness of the photoresist layer is approximately less than about 2000 angstroms.

7. The method of claim 1 wherein the thickness of the photoresist layer is approximately between about 200 angstroms to about 1000 angstroms.

8. The method of claim 1 wherein the second layer is formed at a bottom space between the photoresist portions.

9. The method of claim 1 wherein the second layer is formed on lateral sides of the photoresist portions.

10. The method of claim 1 wherein the second layer is formed over the photoresist portions.

11. The method of claim 1 wherein the second layer comprises an organic material.

12. The method of claim 1 wherein the second layer comprises an inorganic material deposited on the substrate.

13. The method of claim 1 wherein the second layer is a material selected from the group consisting of Si, Ti, Ta, TiN, W, Fe, Cu, C, double bond, benzyl, phenyl, and triple bond atom and molecular.

14. The method of claim 1 wherein the removing comprises a plasma etch treatment.

15. The method of claim 1 wherein the removing comprises a wet etch chemical treatment.

16. The method of claim 1 wherein the removing comprises a solvent etch treatment.

17. A method for forming a semiconductor device, comprising:
    forming a plurality of photoresist portions over a substrate wherein the thickness of the photoresist portions is less than about 2000 angstroms, and wherein the photoresist portions are formed following the development of a photoresist layer;
    forming a second patterning layer between the photoresist portions;
    removing the photoresist portions following the formation of the second layer; and
    processing the substrate using the second patterning layer to protect a portion of the substrate from the processing.

18. The method of claim 17 wherein the thickness of the photoresist portions is between about 200 angstroms and about 1000 angstroms.

19. The method of claim 17 wherein the second patterning layer protects the portion of the substrate from an etching process.

20. The method of claim 17 wherein the second patterning layer protects the portion of the substrate from an implanting process.

21. A method for forming a partial semiconductor device, comprising:
    forming a first layer including a photoresist layer over a substrate wherein the thickness of the photoresist layer is between about 200 angstroms and 1000 angstroms;
    developing the photoresist layer to form photoresist portions;
    forming a second layer between adjacent photoresist portions;
    removing the photoresist portions;
    etching portions of the partial semiconductor device that are not protected by the second layer; and
    removing the second layer.

22. The method of claim 21 wherein the etching comprises etching portions of a bottom anti-reflective coating (BARC) layer.

23. The method of claim 21 wherein the etching comprises etching portions of a dielectric layer.

* * * * *